United States Patent [19]
Fernandez

[11] 3,940,707
[45] Feb. 24, 1976

[54] ELECTRONIC DEVICES FOR THE AUTOMATIC CONTROL OF GAIN AND ROLL-OFF IN AMPLIFIERS

[75] Inventor: Rafael Herrera Fernandez, Madrid, Spain

[73] Assignee: Industrias Rumbo, S.A., Madrid, Spain

[22] Filed: June 5, 1974

[21] Appl. No.: 476,465

[30] Foreign Application Priority Data
June 6, 1973 Spain .................................. 415581

[52] U.S. Cl. ...................... 330/29; 330/28; 330/52; 330/107; 330/143
[51] Int. Cl.² ......................................... H03G 3/30
[58] Field of Search ............ 330/28, 29, 52, 86, 59, 330/107, 109, 132, 143; 325/319, 413; 179/1 VL, 170 A, 107 OT

[56] References Cited
UNITED STATES PATENTS

| | | | |
|---|---|---|---|
| 2,151,821 | 3/1939 | Wilson | 330/52 X |
| 2,340,813 | 2/1944 | Kreer et al. | 330/52 X |
| 3,243,719 | 3/1966 | Scaroni | 330/29 |
| 3,441,866 | 4/1969 | Barber et al. | 330/29 |

FOREIGN PATENTS OR APPLICATIONS

| | | | |
|---|---|---|---|
| 211,430 | 4/1956 | Australia | 330/52 |

Primary Examiner—James B. Mullins
Attorney, Agent, or Firm—Fleit & Jacobson

[57] ABSTRACT

An electronic circuit for automatically controlling gain and roll-off in wide-band amplifiers for use in tele-distribution systems including a feedback network with a negative temperature coefficient pure ohmic resistance feedback. When automatically controlling roll-off, a second negative temperature coefficient resistance is placed in series with an inductance.

2 Claims, 3 Drawing Figures

ELECTRONIC DEVICES FOR THE AUTOMATIC CONTROL OF GAIN AND ROLL-OFF IN AMPLIFIERS

The present invention relates to amplifiers, and more particularly to electronic amplifier circuits for automatically controlling the gain and roll-off. More particularly, the inventive circuits find specific application in wide-band amplifiers used in the primary lines of tele-distribution systems.

The conventional amplifiers used in such tele-distribution systems have the disadvantage of low gain per stage, and as a result, more than one stage of amplification is currently the practice. If the gain of the first amplifier stage decreases, the noise level of the amplifier increases because the action of the second stage becomes felt. Similarly, if the second-stage gain is high, overloading of the first stage is unimportant and the overload level of the amplifier is consequently high. However, if the gain of the second stage is reduced, the overload level of the amplifier due to first-stage overloading is reduced.

The mutual effect of amplifier stages upon one another being very great, all of the above difficulties must be considered in designing the conventional multi-stage amplifier. If the operating characteristics of the amplifier are to be optimal (especially its maximum output level and its noise factor), the amplifier must be designed as a total package. That is, each amplifier stage must be designed with the remaining stages being carefully considered. In addition to the foregoing, the design of the conventional multi-stage amplifier requires that consideration be given to another very important characteristic, the operating points of the transistors constituting the various stages. The result of reducing gain by changing transistor bias will certainly be to modify one of the two previously mentioned characteristics. First, if transistor gain is lowered by a reduction of the current passing through it, its maximum output will be reduced. And second, if the gain is reduced by increasing the current, the internal noise will increase and consequently the noise level.

Nor should the gain of an amplifier be reduced by filter circuits incorporated in the amplifier. Such filter circuits produce losses at frequencies where less amplification is required. Attenuation preceding an amplifier stage increases the noise figure of the amplifier by a number of decebels equal to the attenuation. If the filters are located at the output, on the other hand, the maximum output level of the amplifier will be reduced.

Another way to reduce the gain of an amplifier is to use negative feedback. In this manner, the aforementioned characteristics of the amplifier are not adversely affected. Indeed, the characteristics are actually improved if operating conditions vary. Such feedback presupposes that the gain is decreased at all frequencies, although the feedback can be made a function of frequency.

The present invention relates to a circuit in which selective feedback as a function of frequency is employed. In particular, the invention relates to a circuit which sends a portion of the amplifier's output signal back to its own input, adding the 180° phase-shifted return signal to the amplifier's input signal, in such a manner that the feedback is a function of frequency.

The desired result is effected in the inventive circuit by making the characteristics of the negative feedback circuit automatically vary. The inventive circuit includes a pure resistance in the feedback path in which the ohmic value automatically varies within certain pre-established limits to produce a variation in the degree of coupling between the output and input signals and therefore in the degree of feedback, with the ensuing automatic changes in the gain of the amplifier.

According to the present invention the resistance is varied by means of an external signal, which is a pilot signal detected at an appropriate point in the tele-distribution system for varying the gain characteristic of the amplifier to which the circuit is coupled. The variation of the ohmic value of the variable resistor is not produced by mechanical means. Rather, the resistor used is a non-linear negative temperature coefficient resistor, and the ohmic variation is produced by means of a control current which heats the resistor.

The control current will be variable depending on the points where it is necessary to locate the detector of the signal-amplitude variations. In the event that these signals are weak, they are amplified to a sufficiently high level to produce changes in the ohmic value of the negative temperature coefficient resistance by heating.

There are two types of current delivered to the negative temperature coefficient resistor. First, there are high frequency currents which are a fraction of the amplifier's output signal applied to its input with a 180° phase shift. This fraction of the output signal is variable in order to produce different gains. Second, there is the control current, which is a direct current so it can be more easily blocked, and which heats the negative temperature coefficient resistor in order to vary its ohmic value. This control current, in most cases, will be amplified to the proper level before flowing to the negative temperature coefficient resistor to enable the device to respond to small changes in the amplitude of the signals.

The advantages and details of the present invention will be seen with greater clarity from the detailed description of an example set forth in the following paragraphs with reference to the accompanying drawings in which.

Figure 1:
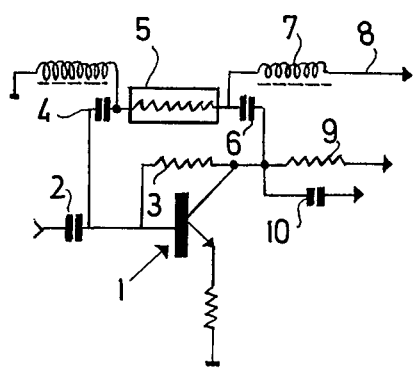
FIG. 1 is the circuit diagram of the device for automatically changing the gain of an amplifier stage.

In FIG. 1 the amplifier stage consists of an NPN transistor 1 with its base connected, through a capacitor 2, to the output of the previous stage or to the source of signals to be amplified. The base of transistor 1 is connected to the collector thereof by means of a parallel connection of a resistor 3 and a series branch comprising a capacitor 4, a negative temperature coefficient resistor 5 and a capacitor 6. The control current for the resistor 5 is supplied by a servo-amplifier (not shown) which delivers a variable strength direct current depending upon the level of a pilot signal detected at certain locations in the circuit. The collector of transistor 1 is further connected, by way of a capacitor 6 and a coil 7, to terminal 8 for the automatic gain control current. In addition, the collector of transistor 1 associates with a power supply through a resistor 9, and serves as the output terminal of the circuit or the input to the following stage through a capacitor 10. The remaining coil 12 serves as the return path for the DC pilot signal.

Figure 2:
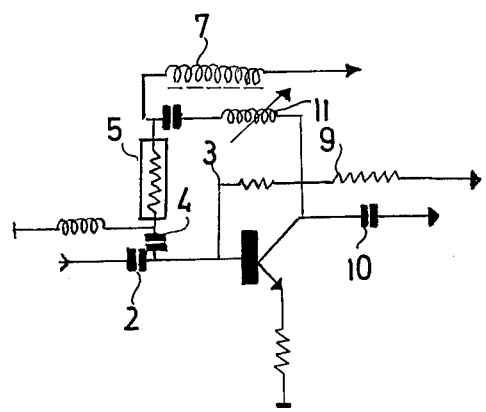
FIG. 2 is a diagram similar to FIG. 1, but relates to automatically changing the roll-off of an amplifier stage.

FIG. 2 shows, as already indicated above, a circuit similar to that of FIG. 1, but directed to the automatic control of roll-off. The elements in this circuit performing the same function as in FIG. 1 are shown with the same reference numbers, and will not again be described. This circuit of FIG. 2 differs from that of FIG. 1 only in that the feedback circuit including the negative temperature coefficient resistor 5 is further in series with an inductance 11. This is done in the roll-off arrangement since it is necessary that the feedback circuit not have a flat characteristic as in the case of automatic gain control. With the inclusion of the inductance 11 in series with the resistor 5, the result is that there is no gain control in the high frequency region because the coil predominates, and as frequency decreases, the degree of negative feedback increases and so continues to increase down to the lower frequency region of the amplifier pass-band.

Figure 3:
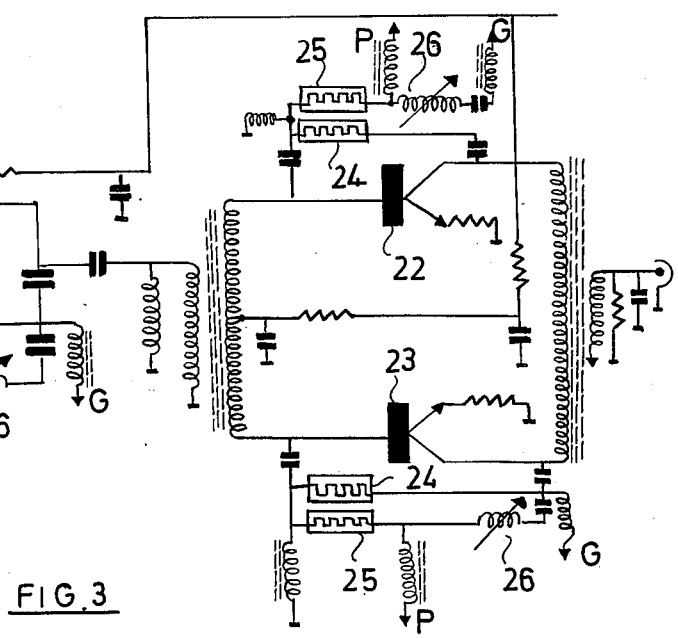
FIG. 3 is a circuit diagram of a repeater amplifier with both roll-off and automatic gain control.

FIG. 3 shows a circuit diagram of an amplifier provided with both roll-off and automatic gain control. In this amplifier, each transistor 21, 22 and 23 has feedback across its base and collector, including two parallelly connected negative temperature coefficient resistors 24 and 25. Resistor 24 serves for automatic gain control and resistor 25 for automatic roll-off control, the latter resistance 25 being connected in series with an inductor 26. The letter P indicates the automatic roll-off control terminals and the letter G indicates the automatic gain control terminals. In this regard, the automatic gain control circuitry receives pilot signals of a frequency higher than those received by the automatic roll-off control circuitry. Furthermore, the servo-amplifier may be common to numerous of the temperature variable resistance elements.

As is usual in amplifiers such as that described above, the various stages and the output stage are coupled by means of coupling transformers 27.

What is claimed is:

1. In an electronic circuit for the automatic control of gain and roll-off in amplifiers having input and output terminals and feedback therebetween especially wide-band amplifiers for use in the primary line of tele-distribution systems, the improvement wherein the feedback network includes a first pure ohmic resistance, the value of which is automatically variable within preestablished limits as a function of the level of a variable intensity current pilot signal, a first capacitor coupling one side of said first ohmic resistance to the amplifier output terminal, and a second capacitor coupling the other side of said first ohmic resistance to the amplifier input terminal, an inductance having one side coupled between said one side of said first ohmic resistance and said first capacitor for applying a variable intensity current pilot signal to said first ohmic resistance, a return path for said variable intensity current pilot signal coupled between said other side of said first ohmic resistance and said second capacitor to furnish a control current to said first ohmic resistance causing it to change its ohmic value to achieve control of gain and roll-off, a second negative temperature coefficicent ohmic resistance in series with an inductance in the feedback network and means provided to inject a pilot signal of lower frequency into said second ohmic resistance, said second ohmic resistance and said serially connected inductance being connected in parallel with said first ohmic resistance.

2. An electronic circuit for automatically controlling gain and roll-off in wide-band amplifiers for use in teledistribution systems comprising, in combination, a feed-back network connected between said amplifier input and output terminals and including a negative temperature co-efficient resistor, a first capacitor for coupling one end of said resistor to said amplifier output terminal, a variable inductance connected between said first capacitor and said amplifier output terminal, a second capacitor for coupling the other end of said resistor to said amplifier input terminal, a first inductance connected at one end between said first capacitor and said resistor one end for supplying a control current to said amplifier from an associated controlled circuit, a second inductance connected at one end between said second capacitor and said resistor other end, the other end of said second inductance being connected to ground, said first and second inductances and said resistor being serially connected to provide a path for a variable intensity current corresponding to the level of a pilot signal detected in the circuit to vary the ohmic value of said resistor for automatically varying the feedback and the gain in said amplifier.

* * * * *